(12) United States Patent
Liu

(10) Patent No.: US 11,171,645 B1
(45) Date of Patent: Nov. 9, 2021

(54) TRANSISTOR SWITCHING CIRCUIT AND INTEGRATED CIRCUIT THEREOF

(71) Applicant: Geo Micro Devices (Xiamen) Co., Ltd, Xiamen (CN)

(72) Inventor: Hengsheng Liu, Shanghai (CN)

(73) Assignee: GEO MICRO DEVICES (XIAMEN) CO., LTD, Xiamen (CN)

( * ) Notice: Subject to any disclaimer, the term of this patent is extended or adjusted under 35 U.S.C. 154(b) by 0 days.

(21) Appl. No.: 17/134,181

(22) Filed: Dec. 25, 2020

(51) Int. Cl.
| | | |
|---|---|---|
| *H03K 17/00* | (2006.01) |
| *H03K 17/06* | (2006.01) |
| *H03K 17/16* | (2006.01) |
| *H03K 17/687* | (2006.01) |
| *H03K 17/693* | (2006.01) |

(52) U.S. Cl.
CPC ......... *H03K 17/687* (2013.01); *H03K 17/063* (2013.01)

(58) Field of Classification Search
None
See application file for complete search history.

(56) References Cited

U.S. PATENT DOCUMENTS

| | | | | |
|---|---|---|---|---|
| 3,942,039 A | * | 3/1976 | Kikuchi | ............. H03K 17/6874 327/389 |
| 7,741,895 B2 | * | 6/2010 | Kihara | ............... H03K 17/6874 327/427 |
| 9,680,466 B2 | * | 6/2017 | Tokai | ................. H03K 17/6871 |

* cited by examiner

*Primary Examiner* — Kenneth B Wells
(74) *Attorney, Agent, or Firm* — Bayramoglu Law Offices LLC

(57) ABSTRACT

A transistor switching circuit and an integrated circuit thereof are provided. The transistor switching circuit includes: at least two transistors M1 and M2, and a voltage follower. The gate of the transistor M1 and the gate of the transistor M2 are connected to a first node G, the first node G is connected to a first current source, and the source of the transistor M1 and the source of the transistor M2 are connected to a second node S1. The voltage follower includes a transistor M3 and a second current source. The gate of the transistor M3 is connected to the second node S1, and the source of the transistor M3 is connected to the second current source. One end of a resistive device is connected to the source of the transistor M3, and another end of the resistive device is connected to the first node G.

19 Claims, 2 Drawing Sheets

TRANSISTOR SWITCHING CIRCUIT AND INTEGRATED CIRCUIT THEREOF

TECHNICAL FIELD

The present disclosure relates to the field of semiconductor technologies, and more particularly, to a transistor switching circuit and an integrated circuit thereof.

BACKGROUND

In semiconductor integrated circuits, transistors are commonly employed to constitute switches. That is, the switches may be enabled or disabled by controlling on or off of the transistors. Specifically referring to FIG. 1, which is a schematic diagram of an existing switching circuit, the switching circuit includes a plurality of transistors, i.e., a transistor M1 and a transistor M2. The gates of the transistors are connected to a current source to provide a gate voltage to the transistor.

As shown in FIG. 1, in the existing transistor switching circuit, a resistor R may be connected between the gate and the source of the transistors, such that an electric current of the current source flows through the resistor R to generate a gate-source voltage to control on or off of the transistor M1 and the transistor M2.

However, since one end of the resistor R is connected to the sources of the transistors, on this basis, when the transistors are on, the electric current flowing through the resistor R may further flow through the transistor transistors, such that there exists a voltage drop across drain terminals (i.e., drain terminal A and drain terminal B) of the transistors, which may cause signal deviation.

SUMMARY

An objective of the present disclosure is to provide a transistor switching circuit and an integrated circuit thereof to solve a problem of voltage drop caused by a control current flowing through an existing transistor switching circuit.

To solve the above technical problem, according to a first aspect of the present disclosure, a new switching circuit is proposed here, which includes:

at least two transistors M1 and M2, the gate of the transistor M1 and the gate of the transistor M2 being connected to a first node G, the first node G being connected to a first current source, the source of the transistor M1 and the source of the transistor M2 being connected to a second node S1; and a voltage follower including a transistor M3 and a second current source, wherein the gate of the transistor M3 is connected to the second node S1, and the source of the transistor M3 is connected to the second current source. The resistive device is connected between the first node G and the source of the transistor M3.

Alternatively, for the transistor switching circuit, the drain of the transistor M3 is connected to a high voltage V2+.

Alternatively, the transistor switching circuit further includes a resistive device, which is connected between the first node G and the source of the transistor M3.

Alternatively, for the transistor switching circuit, the resistive device includes a resistor, which is connected between the first node G and the source of the transistor M3.

Alternatively, for the transistor switching circuit, the resistive device includes a transistor M4, wherein the gate of the transistor M4 is connected to the drain of the transistor M4 and is further connected to the first node G, and the source of the transistor M4 is connected to the source of the transistor M3.

Alternatively, for the transistor switching circuit, the transistors M1, M2 and M3 are transistors of the same conductivity type.

Alternatively, for the transistor switching circuit, the transistors are N-type transistors, the first current source is connected to a high voltage V1+, and the second current source is connected to a low voltage V−.

Alternatively, for the transistor switching circuit, the transistors are P-type transistors, the first current source is connected to a low voltage V1−, and the second current source is connected to a high voltage V+.

Alternatively, for the transistor switching circuit, the voltage V2+ and the voltage V1+ are the same and are generated by the same voltage source or are generated by different voltage sources; or the voltage V2+ and the voltage V1+ are different and are generated by different voltage sources.

The voltage V2− and the voltage V1− are the same and are generated by the same voltage source or are generated by different voltage sources; or the voltage V2− and the voltage V1− are different and are generated by different voltage sources.

According to a second aspect of the present disclosure, an integrated circuit is provided, which includes the transistor switching circuit.

In the transistor switching circuit provided by the present disclosure, by arranging a voltage follower in the transistor switching circuit, a control current may not flow through the transistor M1 and the transistor M2, such that no voltage drop is generated when the transistor M1 and the transistor M2 are on. In this way, a signal error caused by a poor structure of a system may be reduced, which is advantageous to improve the accuracy of signal transmission.

Figure 1:
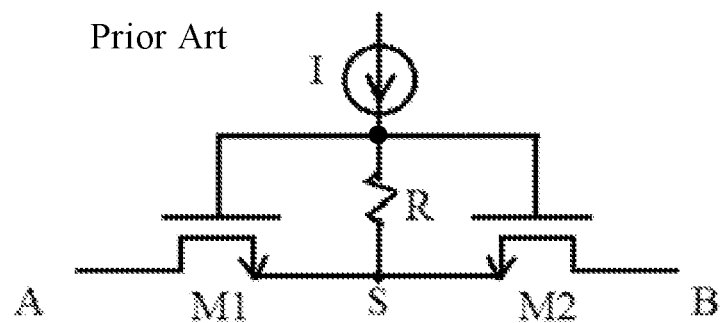
FIG. 1 is a schematic diagram of an existing transistor switching circuit.

Reference numerals in the accompanying drawings are as follows:

M1-transistor;
M2-transistor;
M3-transistor;
M4-transistor;
R-resistor;
I1-first current source;
I2-second current source;
G-first node;
S1-second node; and
S3-third node.

DETAILED DESCRIPTION OF THE EMBODIMENTS

The transistor switching circuit and the integrated circuit thereof provided by the present disclosure are further described below in detail with reference to the accompanying drawings and specific embodiments. Advantages and features of the present disclosure will become more apparent based on the following description. It is to be noted that the accompanying drawings are in a very simplified form and all use imprecise proportions, which are merely intended for conveniently and clearly assisting in explaining the objectives of the embodiments of the present disclosure.

Embodiment I

Figure 2:
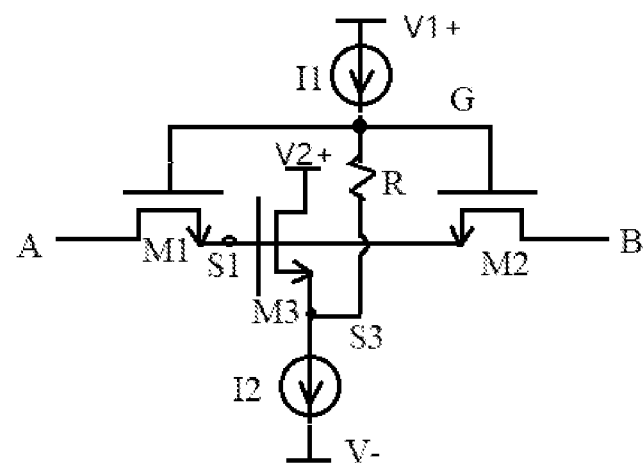
FIG. 2 is a schematic diagram of a transistor switching circuit according to Embodiment I of the present disclosure.

FIG. 2 is a schematic diagram of a transistor switching circuit according to Embodiment I of the present disclosure. As shown in FIG. 2, the transistor switching circuit includes two transistors M1 and M2 and a voltage follower, wherein the voltage follower is connected between the gates and the sources of the two transistors M1 and M2.

Specifically, the transistors M1 and M2 are used as switch transistors in the present disclosure.

Further, each of the number of the transistors M1 and the number of the transistors M2 is not limited to one.

As shown in FIG. 2, the gates of the transistor M1 and the transistor M2 are connected to a first node G, the first node G is connected to a first current source I1, and the sources of the transistors M1 and M2 are connected to a second node S1. The voltage follower is connected between the first node G and the second node S1. The voltage follower includes a transistor M3 and a second current source I2, wherein the gate of the transistor M3 is connected to the second node S1, the source of the transistor M3 is connected to the second current source, a resistive device is connected to the first node G and the source of transistor M3 and converges at a third node S3.

Specifically, the first current source I1 applies a voltage to the gates of the transistors M1 and M2 through the resistive device. When a voltage difference between the gate and the source of the transistor reaches a threshold voltage of the transistor, the transistor is on.

In the transistor switching circuit of this embodiment, the voltage follower is connected between the gates and the sources of the transistors M1 and M2, and the voltage follower is also connected to a second current source I2, such that the voltage follower may form a loop between the first current source I1 and the second current source I2. In this way, the control current correspondingly generated by the first current source I1 can be discharged in the second current source I2 in the voltage follower. Thus, the problem of voltage difference at the drain terminal of a transistor caused by the control current flowing through the transistor can be avoided.

Further, the first current source I1 and the second current source I2 may be correspondingly selected according to the type of the transistor. In this embodiment, the transistor is an N-type transistor.

With continued reference to FIG. 2, the transistor M1 and the transistor M2 are of the same conductive type. That is, in this embodiment, the transistor M1 and the transistor M2 are both N-type transistors. Based on this, by controlling the voltage difference between the first node G and the second node S1, on and off of the transistor M1 and the transistor M2 can be simultaneously controlled.

As described above, the control current in the voltage follower does not flow through the transistor M1 and the transistor M2, correspondingly, there may exist no voltage difference between the drain terminal A of the transistor M1 and the drain terminal B of the transistor M2.

With continued reference to FIG. 2, the drain of the transistor M3 of the voltage follower is connected to a high voltage V2+.

The transistor M3 and the transistors M1 and M2 are of the same conductivity type. In this embodiment, the transistors M1 and M2 and the transistor M3 are all N-type transistors.

Further, the transistor switching circuit also includes a resistive device. Specifically, in this embodiment, the transistor switching circuit includes a resistor R connected between the first node G and the second current source I2. That is, in this embodiment, the first current source I1, the resistor and the second current source I2 may form a current loop in the voltage follower, such that the control current in the voltage follower can be discharged. The resistance value of the resistor R may be adjusted correspondingly according to actual requirements, and no limitation is imposed herein.

Specifically, in this embodiment, when the first current source I1 is switched on, a high voltage is applied to the first node G. In this case, gate voltages of the transistors M1 and M2 are correspondingly increased through the first node G, and the voltage differences between the gate and the source of the transistors M1 and M2 both exceed the threshold voltage, such that the transistors M1 and M2 are on, and the control current can be discharged through the voltage follower.

The current source I1 flows out of a high voltage V1+, and the current source I2 flows into a low voltage V−. The V1+ and the V2+ may be the same or may be different. For example, the V1+ and the V2+ are different when they are generated by different voltage sources; and the V1+ and the V2+ are the same when they are generated by the same voltage source.

Embodiment II

The difference between Embodiment II and Embodiment I is that in the transistor switching circuit of this embodiment, the resistive device includes a transistor M4.

Figure 3:
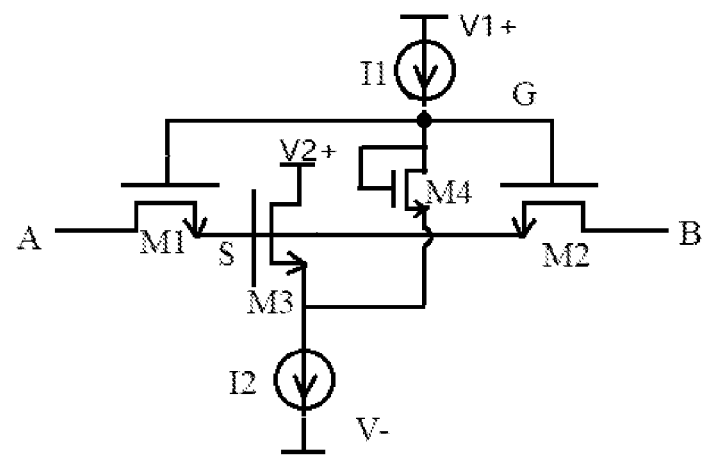
FIG. 3 is a schematic diagram of a transistor switching circuit according to Embodiment II of the present disclosure.

FIG. 3 is a schematic structural diagram of the transistor switching circuit according to Embodiment II of the present disclosure. As shown in FIG. 3, in this embodiment, the resistive device in the voltage follower includes the transistor M4, wherein the gate of the transistor M4 is connected to the drain of the transistor M4 and is further connected to the first node G, and the source of the transistor M4 is connected to the second current source I2.

The transistor M4 may be an N-type transistor or a P-type transistor. In this embodiment, a description is made by taking an example where the transistor M4 is an N-type transistor.

It is to be noted that the resistive device in Embodiment I includes a resistor R, and the resistive device in this embodiment includes the transistor M4. However, it is to be appreciated that in actual applications, the type and number of the resistive devices may be adjusted according to actual circuits. For example, the resistive device may include one or more resistors R, or may also include one or more transistors M4, or may also include a resistor and the transistor M4 simultaneously.

Embodiment III

The difference between Embodiment III and Embodiment I is that the transistors in embodiment III are a P-type transistor, Hereinafter, with reference to FIG. 4, the transistors switching circuit in embodiment III are described in detail.

Figure 4:
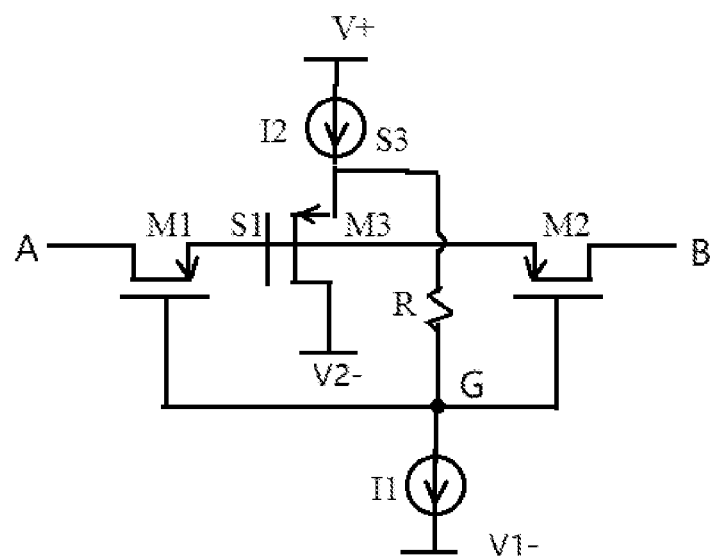
FIG. 4 is a schematic diagram of a transistor switching circuit according to Embodiment III of the present disclosure.

FIG. 4 is a schematic structural diagram of the transistor switching circuit according to Embodiment III of the present disclosure. As shown in FIG. 4, the transistor M1 and the transistor M2 in this embodiment are both P-type transistors. The first current source I1 is connected to a low voltage V1− to provide a low-level gate voltage to the transistor M1 and the transistor M2. The second current source I2 is connected to a high voltage V+.

Specifically, when the first current source I1 is not switched on, the voltage differences between the gate voltage (i.e., the voltage of the first node G) and the source voltage of the transistors M1 and M2 do not exceed the threshold voltage at this moment, and thus the transistor M1 and the transistor M2 are off. When the first current source I1 is switched on to apply a voltage to the first node G, the gate voltages of the transistors M1 and M2 drop, and the voltage differences between the gate voltage and the source voltage of the transistors M1 and M2 exceed the threshold voltage, such that the transistor M1 and the transistor M2 are on.

With continued reference to FIG. 4, similar to Embodiment I, the voltage follower includes a transistor M3 and a resistor. The conductivity type of the transistor M3 is the same as that of the transistors M1 and M2, i.e., they are all P-type transistors. The drain of the transistor M3 is connected to a low voltage V2−. The V2− and the V1− may be the same or may be different. For example, the V2− and the V1− are different when they are generated by different voltage sources; and the V2− and the V1− are the same when they are generated by the same voltage source.

In addition, it is to be noted that the resistive device in this embodiment includes a resistor R. However, in combination with Embodiment I and Embodiment II, the resistor R in the resistive device may also be replaced by the transistor M4, or the resistive device may also include the resistor R and the transistor M4 simultaneously.

Embodiment IV

This embodiment of the present disclosure also provides an integrated circuit, which includes the transistor switching circuit.

In the transistor switching circuit provided by the present disclosure, by arranging a voltage follower in the transistor switching circuit, a control current may not flow through a transistor M1 and a transistor M2, such that no voltage drop is generated when the transistor M1 and the transistor M2 are enabled. In this way, a signal error caused by a poor structure of a system may be reduced, which is advantageous to improve the accuracy of signal transmission.

Based on this, when the transistor switching circuit provided by the present disclosure is applied to a semiconductor integrated circuit, the stability of the semiconductor integrated circuit can be correspondingly improved, and the accuracy of signal transmission of the semiconductor integrated circuit can be improved.

It is to be noted that the embodiments in the specification are described in a progressive manner. Each embodiment is focused on difference from other embodiments. And cross reference is available for identical or similar parts among different embodiments. System embodiments are basically similar to method embodiments, thus description of the system embodiments is relatively simple, and reference can be made to the description of the method embodiments for relevant parts.

It is also to be noted that although the present disclosure is disclosed by the above preferred embodiments, the above embodiments are not intended to limit the present disclosure. Those skilled in the art, without departing from the scope of the technical solution of the present disclosure, may make a plurality of changes and modifications of the technical solution of the present disclosure by the technical content disclosed above, or modify as equivalent embodiments of equivalent variations. Therefore, without departing from the scope of the technical solution of the present disclosure, any simple alterations, equivalent variations and modifications based on technical essences of the present disclosure still fall within the protection scope of the technical solution of the present disclosure.

In addition, unless otherwise specified or pointed out, it is also to be understood that the terms "first", "second", "third" and the like in the specification are merely intended for distinguishing between various components, elements, steps and the like in the specification, not intended for representing a logical relationship or an order relationship between the various components, elements, and steps.

What is claimed is:

1. A transistor switching circuit, comprising:
at least two transistors, wherein a gate of a first transistor of the at least two transistors and a gate of a second transistor of the at least two transistors are connected to a first node; the first node is connected to a first current source, and a source of the first transistor and a source of the second transistor are connected to a second node; and
a voltage follower comprising a third transistor and a second current source, wherein a gate of the third transistor is directly connected to the second node, and a source of the third transistor is connected to the second current source,
wherein the first transistor, the second transistor, and the third transistor are transistors of a same conductivity type.

2. The transistor switching circuit according to claim 1, wherein a drain of the third transistor is connected to a first high voltage or a first low voltage.

3. The transistor switching circuit according to claim 1, further comprising a resistive device, wherein the resistive device is connected between the first node and the source of the third transistor.

4. The transistor switching circuit according to claim 3, wherein the resistive device comprises a resistor, wherein the resistor is connected between the first node and the source of the third transistor.

5. The transistor switching circuit according to claim 3, wherein the resistive device comprises a fourth transistor; a gate of the fourth transistor is connected to a drain of the fourth transistor, and the gate of the fourth transistor is further connected to the first node; and a source of the fourth transistor is connected to the source of the third transistor.

6. The transistor switching circuit according to claim 1, wherein the first transistor, the second transistor and the third transistor are N-type transistors; the first current source is connected to a second high voltage, and the second current source is connected to a second low voltage.

7. The transistor switching circuit according to claim 1, wherein the first transistor, the second transistor and the third transistor are P-type transistors; the first current source is connected to a second low voltage, and the second current source is connected to a second high voltage.

8. The transistor switching circuit according to claim 6, wherein
the first low voltage and the second low voltage are identical; alternatively, the first low voltage and the second low voltage are different.

9. An integrated circuit, comprising the transistor switching circuit according to claim 1.

10. The transistor switching circuit according to claim 7, wherein
the first low voltage and the second low voltage are identical; alternatively, the first low voltage and the second low voltage are different.

11. The integrated circuit according to claim 9, wherein a drain of the third transistor is connected to a first high voltage or a first low voltage.

12. The integrated circuit according to claim 9, further comprising a resistive device, wherein the resistive device is connected between the first node and the source of the third transistor.

13. The integrated circuit according to claim 12, wherein the resistive device comprises a resistor, wherein the resistor is connected between the first node and the source of the third transistor.

14. The integrated circuit according to claim 12, wherein the resistive device comprises a fourth transistor; a gate of the fourth transistor is connected to a drain of the fourth transistor, and the gate of the fourth transistor is further connected to the first node; and a source of the fourth transistor is connected to the source of the third transistor.

15. The integrated circuit according to claim 11, wherein the first transistor, the second transistor and the third transistor are transistors of a same conductivity type.

16. The integrated circuit according to claim 15, wherein the first transistor, the second transistor and the third transistor are N-type transistors; the first current source is connected to a second high voltage, and the second current source is connected to a second low voltage.

17. The integrated circuit according to claim 15, wherein the first transistor, the second transistor and the third transistor are P-type transistors; the first current source is connected to a second low voltage, and the second current source is connected to a second high voltage.

18. The integrated circuit according to claim 16, wherein the first low voltage and the second low voltage are identical; alternatively, the first low voltage and the second low voltage are different.

19. The integrated circuit according to claim 17, wherein the first low voltage and the second low voltage are identical; alternatively, the first low voltage and the second low voltage are different.

* * * * *